United States Patent [19]

Darden et al.

[11] Patent Number: 4,941,841

[45] Date of Patent: Jul. 17, 1990

[54] ADAPTER AND A REMOVABLE SLIDE-IN CARTRIDGE FOR AN INFORMATION STORAGE SYSTEM

[76] Inventors: Julius C. Darden, 1733 Calle Artigas, Thousand Oaks, Calif. 91360; Miguel M. Praca, 21 Thornton Ave. #3, Venice, Calif. 90291; Philip J. Tomasi, 205 Pepper St., Newbury Park, Calif. 91320

[21] Appl. No.: 406,197

[22] Filed: Sep. 11, 1989

Related U.S. Application Data

[63] Continuation-in-part of Ser. No. 204,456, Jun. 9, 1988, abandoned.

[51] Int. Cl.$^5$ .......................................... H01R 13/629
[52] U.S. Cl. .................................... 439/377; 439/374; 364/708; 369/75.1
[58] Field of Search ............................... 439/296–298, 439/374, 377; 369/75.1; 364/707, 708

[56] References Cited

U.S. PATENT DOCUMENTS

| | | | |
|---|---|---|---|
| 3,913,136 | 10/1975 | Kelch et al. | 360/96.6 |
| 4,479,198 | 10/1984 | Romano et al. | 364/708 |
| 4,633,350 | 12/1986 | Hanson | 369/75.1 |
| 4,669,053 | 5/1987 | Krenz | 364/708 |
| 4,717,982 | 1/1988 | Toreson et al. | 364/708 |
| 4,725,244 | 2/1988 | Chewning et al. | 364/708 |
| 4,754,397 | 6/1988 | Varaiya et al. | 369/75.1 |
| 4,853,830 | 8/1989 | Corfits et al. | 439/296 |

OTHER PUBLICATIONS

IBM Technical Disclosure Bulletin, "Customer Set-Up and Replaceable DASD Assemblies", vol. 27, No. 7B, Dec., 1984, p. 4206.

Primary Examiner—Gary F. Paumen
Attorney, Agent, or Firm—Jack C. Munro

[57] ABSTRACT

An adapter is provided for a removable information storage device in an information storage and retrieval system or control system. There is a mounting bracket permanently installed in a half-height space and hooked up to the wires already provided for in the system. A separate box-like cartridge component permanently houses the information storage device. The cartridge has electrical connections for connecting the information storage device to a mateable connector mounted on the back face of the cartridge. The mounting bracket likewise has a complementary mateable connector mounted on it so that both connectors will plug together whenever the cartridge is fully inserted into the bracket. This completes the electrical connections and power supply between the information storage device and the system allowing the information storage device to be used as if it were permanently installed in the system. The walls of the cartridge and the bracket engage through a pair of tracks and guideways to align the cartridge as it is inserted in the bracket and to match up the mateable connectors.

4 Claims, 5 Drawing Sheets

ADAPTER AND A REMOVABLE SLIDE-IN CARTRIDGE FOR AN INFORMATION STORAGE SYSTEM

REFERENCE TO PRIOR APPLICATION

This application is a continuation-in-part of U.S. patent application Ser. No. 07/204,456, filed June 9, 1988, by the same title, now abandoned.

BACKGROUND OF THE INVENTION

Electrical computers and other data processing and storage systems with specialized housing for holding an information storage device in an information storage system.

The advent of the personal computer as embodied in the Apple computers and shortly thereafter the IBM PC's, introduced in the late 1970's and early 1980's started a revolution in the computer industry.

The personal computer system includes a video monitor for viewing the data, a keyboard system for entering and manipulating the data, and most importantly, the main housing which is collectively termed the central processing unit, or CPU for short. In the original IBM PC introduced in early 1981, there was in the CPU a space or port for housing a floppy disk drive. The space or port in the CPU allowed for the installation of at least one and usually two floppy disk drives which were installed side-by-side and accessible from the front of the CPU. The shortcomings of a floppy disk drive include the limited amount of information storable on a floppy diskette which was limited to 360 kilobytes of information. The need was apparent to increase the storage capability of the original IBM PC and hence the IBM PC XT was introduced shortly thereafter. The IBM PC XT included on floppy disk drive having a 360 kilobyte storage capability and also a fixed drive permanently installed in the CPU and which was and still is commonly referred to as a Winchester hard drive. This Winchester hard drive was further defined as a 5¼ inch drive and it could hold around 5 megabytes of information. The 5¼ inch Winchester hard drive became and was the standard of the industry for several years. The thickness of the 5¼ inch Winchester hard drive has been reduced by half. The new version is called a half-height 5¼ inch Winchester drive.

Imitators of the IBM PC, also known as clone machines, were introduced to compete with and were compatible with the IBM personal computers. The IBM PC clone manufacturers, likewise, incorporated a Winchester hard drive in the CPU along with a floppy disk drive.

In this rapidly changing technology in personal computer systems, there then arrived on the marketplace what is now termed a hard card which functions like a Winchester hard drive but can be installed in the expansion slots inside the housing or CPU of the computer. Additionally, the Winchester 5¼ inch drive has been succeeded by a smaller more compact unit known as the Winchester 3½ inch unit. This unit has now become one of the industries' standards in the personal computer area.

The advantages of a hard drive system in a personal computer system are apparent in that the computer is able to store a relatively large volume of data permanently and the data is instantly available for retrieval when the computer is turned on. The 3½ inch Winchester drive brought down the cost of the hard drive system significantly to the point where the 3-12 inch Winchester hard drive system is less than half of the cost of the original 5¼ inch Winchester drive system as originally installed in the IBM PC XT and AT systems.

The shortcomings of an integrated hard drive system are that any user of that particular computer who has any rudimentary knowledge on how to run and operate a personal computer can turn on the machine and call up and retrieve the permanently stored information in the hard drive. Several businesses have sensitive data and other information in their computer systems which they would like to remain proprietary and non-accessible except by authorized personnel.

The need for a security system and portable system for a hard drive was apparent and accordingly are the primary reasons for the development of the present invention.

The half-height 5¼ inch Winchester drive has many applications other than being wired into a computer for word processing and data processing. The 5¼ inch half-height Winchester hard drive is multiple application in addition to personal computers. The 5¼ inch Winchester half-height drive is now also used in robotics for control systems, in aircraft and in the recording industry for the recording and storage of notes in digital or analog form.

SUMMARY OF THE INVENTION

One application of the present invention is to provide removable 3½ inch hard disk drive which can be temporarily installed in the CPU and temporarily connected with the electronics in the CPU. After the operator has finished work on the computer, the computer can be turned off and the hard disk drive removed and placed in a safe and secure place. When the next working session requires the use of the data stored in this hard disk drive and cartridge, the operator can quickly insert the hard disk drive and cartridge into the computer and energize the computer and bring up the data stored in the hard drive.

An adapter is provided for a removable hard drive or other information storage device. There is a mounting bracket permanently installed in a half-height space and hooked up to the hard drive wires already provided for in the information storage system. A separate box-like cartridge component permanently houses the hard drive or other information storage device. The cartridge has electrical connections for connecting the information storage system to a mateable connector mounted on the back face of the cartridge. The mounting bracket, likewise has a complementary mateable connector mounted on it so that both connectors will plug together whenever the cartridge is fully inserted into the bracket. This completes the electrical connections and power supply between the information storage device and the computer or information storage system allowing the plug-in hard drive to be used as if it were permanently installed in the computer. The walls of the cartridge and the mounting bracket have a pair of tracks and guideways to align the cartridge as it is inserted in the bracket in order to match up the pair of mateable connectors. Also, the walls of the cartridge have a series of different mounting holes to permit connection to a wide variety of different manufacturers of hard drives.

One option includes a lock and key for locking the cartridge in the support bracket. The cartridge and information storage device can be unlocked and stored in a safe place to prevent unauthorized access to the data stored in the information storage device. Another option includes an on/off switch for the information storage device.

A backup cartridge and hard drive assembly can also be standing by in the event of failure of the cartridge and hard drive already in use or for additional storage in the computer in order to minimize downtime on the computer. A computer is one example of an information storage system, and a 3½ inch hard drive is an example of an information storage device.

The invention comprises two components: a support bracket permanently installed in the disk drive space area of the CPU; and a slide-in cartridge containing an information storage device. The bracket has electrical connections and is permanently plugged into the electronics in the CPU. The bracket has an electrical connector which is a mateable connector for connecting with the slide-in cartridge. The cartridge has the information storage device wired to a mateable electrical connector which is a mateable connector positioned at the rear face of the cartridge. The cartridge slide in and out of the bracket or mount and both pin connectors mate when the cartridge is pushed all the way in the bracket or mount, that is, when such are fully engaged.

Another useful feature of this invention is to have a quickly replaceable and slide-in hard disk drive system. The hard disk is not infallible and occasionally malfunctions and becomes inoperable (crashes). If the hard disk drive system becomes inoperable, the computer is of no use until the hard disk drive system is replaced or otherwise repaired. By having a standby working disk drive in a replaceable cartridge, should the disk drive become disabled, then it can be quickly replaced with a new working unit in a few seconds. This eliminated the down time which would otherwise be required on a typical IBM PC type of system in order to remove the permanently installed Winchester hard drive and replace it with a fresh unit.

There is still yet another reason for this replaceable disk drive system and that is to keep a backup of the same data stored on a backup hard disk drive and cartridge in the event of disablement of the hard disk drive and cartridge in the computer. It can be replaced with the backup disk drive which contains the same data as the first drive which became disable allowing the operator to continue on with the work without having to re-enter the data which would have been lost in the disabled hard disk drive system.

The invention also changes the character of the machine, e.g., operating system or different data files.

As stated in the Background of the Invention, the 5¼ inch Winchester half-height drive is now used in various applications in addition to its traditional one in a computer system. The half-height Winchester drive can be located inside any type of control system or information system or it can even be mounted outside the housing of any given system. The present invention can be substituted wherever a 5¼ inch half-height Winchester drive could be mounted or otherwise located. This is because the overall dimensions of the present invention are equal to or smaller than the space which would be occupied by the 5¼ inch half-height Winchester drive. Accordingly, wherever a 5¼ inch half-height Winchester drive has been already mounted or could be mounted, the present invention could be mounted. The added versatility of the present invention is that the original 5¼ inch Winchester half-height drive is removed and the support bracket of the present invention is mounted in its place. The outside circuitry is then plugged to or otherwise connected to the bracket. The slide-in cartridge with the 3½ inch hard drive Winchester is then slid in and connected to the mounted support bracket.

The present invention functions as an interface between the information storage device and the control system to which the information storage device is connected. The additional feature is that the information storage device is removable rather than being permanently installed. In the application where the present invention is replaced or installed in the personal computer in the area where a half-height 5¼ inch Winchester drive could be installed, the electronic circuitry inside the computer which would normally be connected to the Winchester hard drive is collectively referred to as an outside circuit. This outside electronic circuitry is usually two ribbon cables having ribbon terminators and a "Molex" type of plug. There are two main types of 3½ inch Winchester drives on the market differentiated by their interface. One interface is called the ST/506 and the other one is labeled the ESDI. Both drives are mechanically different for hookup purposes. Assuming an ST/506 interface, if the 3½ inch Winchester hard drive were to be permanently installed in the computer, then the three electrical connections from the computer would hook up with the reciprocal or the complementary terminals on the hard drive. Since the present invention is interposed between the cables in the computer and the terminals on the 3½ inch hard drive, there must be some type of compatible electronic circuitry on the invention to electronically interface between the outside circuit, which are the computer cables and the terminals on the hard drive.

This compatible electronic circuitry can most easily be described schematically. The circuitry from the computer which is called the outside circuit would be labeled A. The circuitry on the support bracket which hooks up with the outside circuitry would be labeled B. The circuitry which connects the cartridge to the 3½ inch hard drive would be labeled C. The terminals comprising the electronic circuitry on the hard drive would be labeled D. Circuitry B and circuitry D are duplicates, that is, they are both structurally identical to one another. Electronic circuitry A and circuitry C are likewise duplicates in that they are structurally identical to each other. Phrased another way, the set of electrical connections from the external circuit and the set of electrical connections extending from the cartridge which connects to the information storage device are the same. The set of electrical terminals on the support bracket and the set of terminals on the information storage device (3½ inch hard drive) are likewise the same, that is, they are both structurally identical and connect with structurally identical complementary electronic plugs.

The different type of information storage devices which would be utilized with the present invention would require the B and C electrical connections be compatible as follows. The B connections which are the terminals on the bracket must be structurally identical to the connecting terminals on the information storage device mounted in the cartridge. The cables which extend from the external circuit must be pre-wired to accommodate the particular type of information storage device which is to be installed in the cartridge. The electrical cables attached to the cartridge and connected or hooked up with the information storage device must be structurally identical to those cables from the external circuit. Accordingly, the electronic circuitry and cables in the present invention will have to be different depending upon the type of information storage device to be used with the invention. However, it is to be understood that the scope of this invention includes the application of a removable cartridge with any type of storage information device with the only requirement that the electrical connections A from the external circuit and the electrical connections C from the cartridge are structurally of functionally equivalent, and that the terminals B or the support bracket are structurally or functionally equivalent to the terminals D on the information storage device. There also must be compatible connectors which are mounted on the cartridge and on the hard disk drive which are mateable so that the two connectors will connect when the cartridge is fully inserted in the bracket. The mateable connectors will then complete the circuitry from the external circuit to the information storage device in the cartridge.

The circuitry could include a power supply cord from the external circuit to energize the information storage device. However, it is forseeable that the information storage device could be battery operated in which case power would not be required from the external circuit to the information storage device.

The front of the slide-in cartridge has an integrated pull handle for ease in inserting and removing the cartridge in the support bracket. However, in some of the information storage devices this front area will have to have openings or slots of some type cut out to allow the insertion and removal of tapes and optical disks which can be fed into the information storage device. In this alternate embodiment, the pull handles would have to be of a different design such as two hooks adjacent to the slot to allow for the user to pull on the two hooks with his index fingers to remove and insert the slide-in cartridge.

DETAILED DESCRIPTION OF THE SHOWN EMBODIMENT

Figures 1, 2:
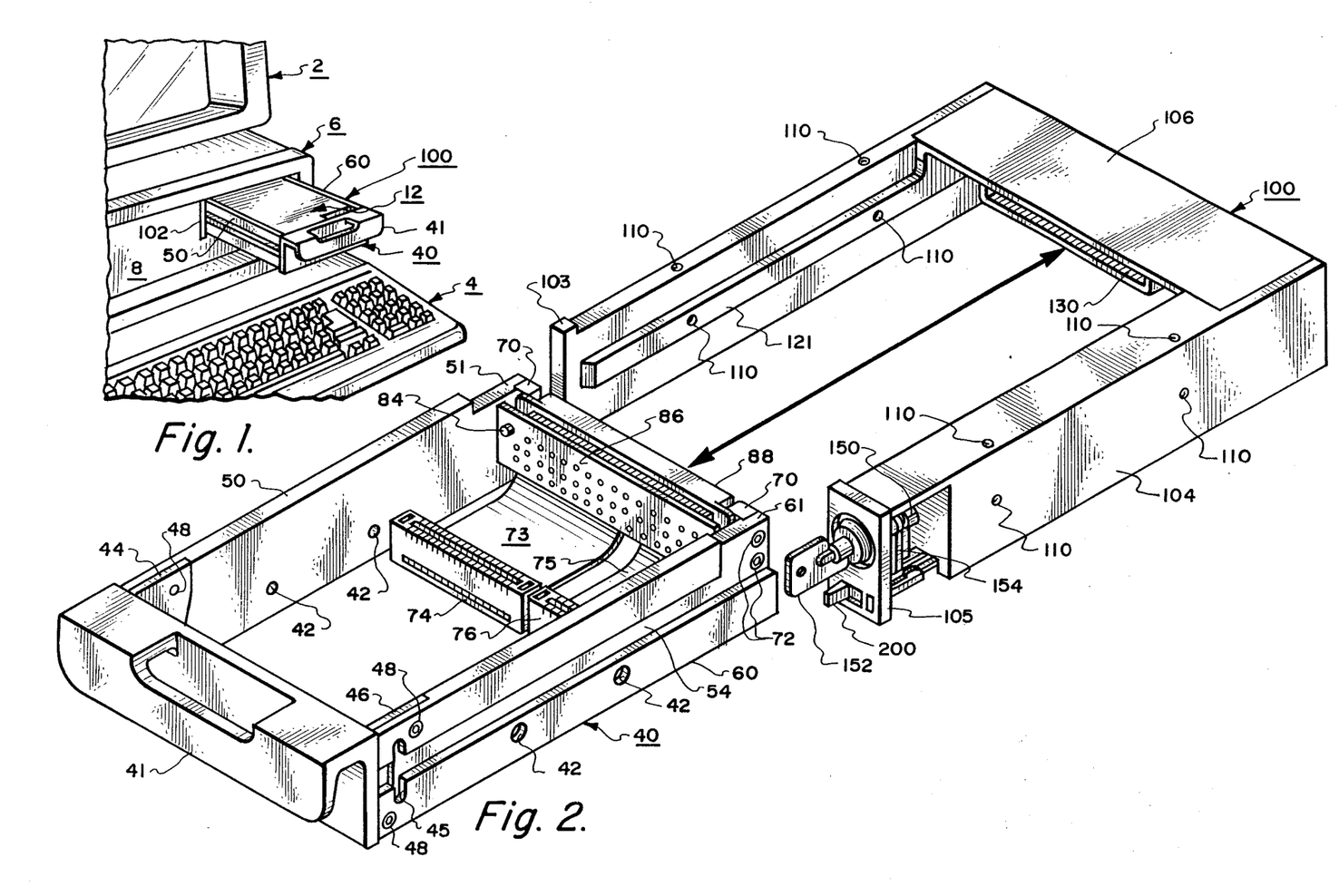
FIG. 1 is a fragmentary isometric view of a personal computer system showing the keyboard, the video monitor, the CPU and the invention installed in the computer and the cartridge is shown partially withdrawn from the mount or support bracket which is installed in the front space area in the CPU.
FIG. 2 is an isometric view showing the two separate components, i.e., the cartridge and the mount or support bracket.
Figure 3:
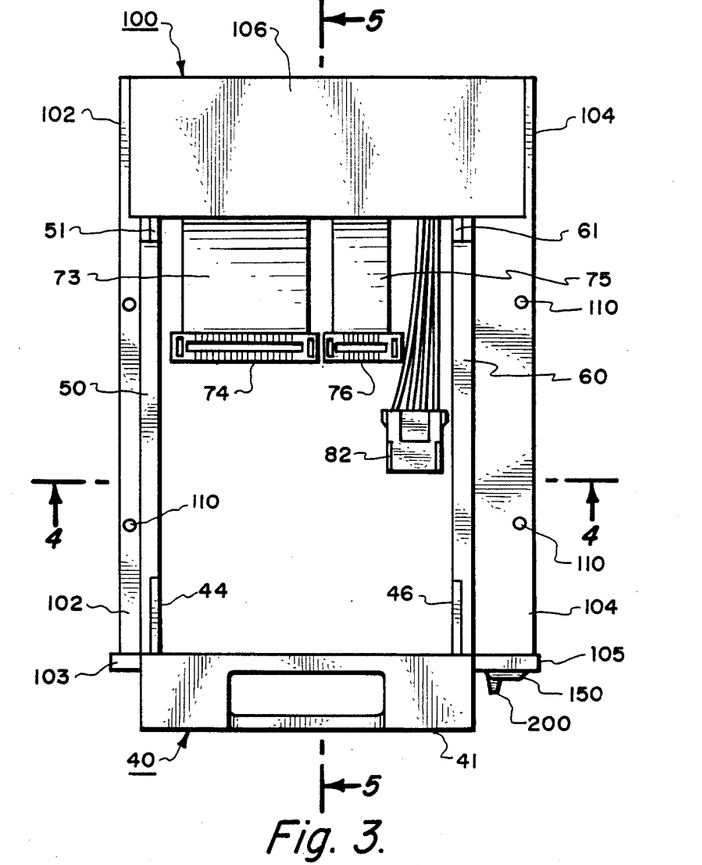
FIG. 3 is a top pan view showing the cartridge and mount or bracket mechanically and electrically connected to each other.
Figure 4:
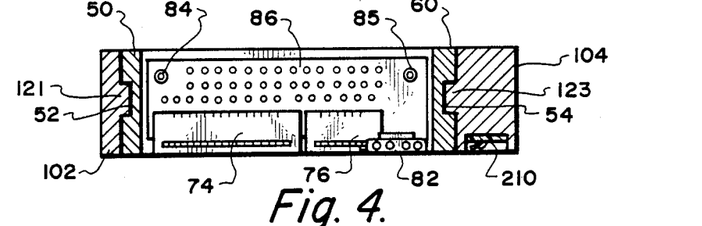
FIG. 4 is a transverse cross-sectional view taken along the lines 4—4 in FIG. 3 showing the track and guide rail of the cartridge and mount or bracket.

Referring now to FIG. 1, a partial view of a typical personal computer system is illustrated showing the location where the present invention is installed. The three main components of a typical personal computer system are disclosed as a monitor or video screen 2 which visually displays the data, a typewriter-like keyboard 4 for allowing the user to input the data into the computer, and the housing 6 which houses the central processing unit, the disk drives, RAM memory chips and all the other electronic components which are necessary to make the personal computer system operable. The housing 6 is commonly referred to as a CPU, although it is to be understood that technically CPU stands for the central processing unit which is the computer microchip or brain which runs the computer system. The front face 8 of the CPU typically has a configuration where spaces are available for installing disk drives of some type. The spaces are occasionally referred to as ports. In a typical computer system presently on the market, there will usually be one 360K floppy disk drive installed for allowing the user to input data by means of a flexible magnetic diskette. On the far right hand side of the port area, there is usually no factory installed hard disk drive on the less expensive computer systems.

In the earlier IBM PC, XT or AT, the front port area had installed a 5¼ inch full height hard drive disk commonly known as a Winchester drive. With the changing technology in this area, the physical dimensions of the hard drives have been reduced considerably including the size of floppy disk drives. The earlier Winchester 5¼ inch hard drive took up a full height space on the front of the computer in the port area. There is now commonly available a half-height system, whether it be a floppy disk drive or a hard disk drive. A face plate can be attached to a half-height disk in order to install it in a full height space.

In the illustration shown in FIG. 1, the present invention is illustrated as a half-height system. In this configuration, there could be two of the present inventions stacked one above the other to form two removable hard drive systems in the computer.

Quite often in the less expensive clones, the right hand section is simply covered with a snap-in plastic face plate. The space available behind this face plate is called a blank in port and allows for easy expansion of the computer system if so desired. The illustrated embodiment of the present invention is intended to be used in any environment wherein an IBM PC, XT, AT, or IBM clone has an earlier 5¼ inch Winchester hard drive either full or half-height which needs replacement or where there is a half-height slot available for installation of the illustrated embodiment of the present invention. Many IBM PC or PC compatible computers will have the necessary connecting hardware already wired inside the CPU for easy installation of the present invention. If not, an expansion card can be installed in one of the expansion slots to interface between the computer and the present invention.

The embodiment of the present invention as illustrated in the drawings and as described supra, discloses the adaptation of a 3½ inch Winchester hard drive to a computer system. However, it must be emphatically repeated and must be understood that this invention is not limited to this particular application. The U-shaped support bracket, also referred to as a mainframe mount in this description, the slide-in cartridge and the interconnecting electrical connections can find widespread application in a variety of environments. The environments can be anywhere where a half-height 5¼ inch Winchester drive could be placed. This is so because the overall dimensions of the bracket and cartridge will fit nicely in any space where a 5¼ inch Winchester hard drive has been or could be located. The environment in which the invention could be utilized could be in any type of control or information storage and retrieval systems whether it is inside the system or mounted external to the system. Control systems are used in robotics. Information storage and retrieval systems are used in computers, aircraft, and the recording industry. Additionally, the references to a 3½ inch Winchester hard drive are recited to show and describe the environment wherein the invention is adapted for use in a computer system. The slide-in cartridge can hold a variety of information storage devices such as a tape drive, a floppy disk drive, an optical disk drive, a solid state memory or another Winchester drive small than the 3½ inch drive. The aforementioned information storage devices will be referred to as such in the remainder of this discussion. For definitional purposes, the term external circuit refers to any cables or electrical connections which connect a system to the present invention.

FIG. 2 shows the two major components comprising the present invention. The first component is the generally U-shaped support bracket means illustrated as a mount or support bracket 100. The second component is the generally box-like hollow rectangular shaped cartridge means illustrated as a cartridge 40 for holding the 3½ inch hard disk drive 12. In FIGS. 2 through 8 the 3½ inch hard disk drive 12 has not been illustrated for clarity purposes when illustrating the elements of the present invention. However, FIG. 1 shows the body of the 3½ inch hard disk drive 12 encased within the cartridge 40 showing that the top of the hard drive fits nicely within the open space of the rectangular shaped cartridge 40.

As previously stated, the IBM PC or PC compatible computer will have electrical connections available either by being factory installed or by having an interface card installed in one of the expansion slots in the CPU 6.

The following electrical connections, which are not illustrated, are needed in the CPU 6 to hook up with the support bracket 100 when a 3½ inch hard drive with an ST/506 interface is used:

1. A 32 pin ribbon connector terminating with a 32 pin ribbon terminator.
2. A 20 pin ribbon connector terminating with a 20 pin ribbon terminator.
3. Mateable half for a "Molex" connector plug. The "Molex" connector plug includes four wires which supply the electricity in 5 volt and 12½ volt increments and also has two ground leads.

The purpose of these three connections is to interconnect the typical 5¼ inch or 3½ inch hard disk drive for installation and hook up inside the CPU. The electrical connections of a typical hard drive likewise include a complementary 32 pin card connector, a 20 pin card connector and a mateable "Molex" plug connector positioned at the back upper exterior surface or casing of the hard disk drive. If one were to permanently install a hard disk drive in a personal computer, one would interconnect these three sets of connections, and the hard disk drive would then be operational. The hard disk drive would be positioned or bolted into place in the disk space or port area inside the CPU.

In order to install a permanent hard disk drive, the cover of the CPU must be removed in order to gain access to the interior of the CPU. A typical hard disk drive will have pre-drilled mounting locations, and instructions which provide for easy installation of the hard disk drive in the proper port in the hard disk spaces provided for in the computer.

The illustrated embodiment of the present invention takes this installation process one step further by installing the support bracket 100 in the same general area where a 5¼ inch hard drive would normally be installed. The mount or support bracket 100 is generally described as having a U-shaped configuration having a left leg 102, a right side leg 104 and a rear cross brace 106, as clearly shown in FIG. 2. This three piece construction of the mount can be and has been fabricated as a one-piece component by an aluminum casting process. It has also been fabricated as a one-piece component by a plastic injection molding process.

Accordingly, in one alternative embodiment, the mount, that is the U-shaped support bracket, is one piece rather than three separate pieces assembled and screwed together. However, as shown in the drawings, the rear cross brace 106 is positioned between the left leg 102 and the right leg 104 and screwed together or otherwise fastened to the two ends of the two legs creating a very secure U-shaped type of mount. There are a plurality of mounting means illustrated as screw hole mounting spots 110 drilled in and around the mount or bracket. The screw hole mounting spots 110 are to provide universal types of mounting means locations so that the mount or bracket can be installed in any variety of IBM PC, XT, AT, or PC compatible types of computers without the necessity of custom drilling any holes in the support bracket 100.

The installation of the present invention is similar to the installation of a 5¼ inch hard disk drive as previously discussed in that the cover of the CPU has to be removed to gain access to the interior area in order to screw into place or otherwise install the support bracket 100 inside the CPU in the hard disk space. After the bracket 100 has been installed by means of using the appropriate mounting screw holes and the accompanying hardware usually provided for with the present invention, the three previously mentioned electrical connections inside the CPU are then connected to the complementary electrical locations on the bracket which will be described in detail infra.

Figure 7:
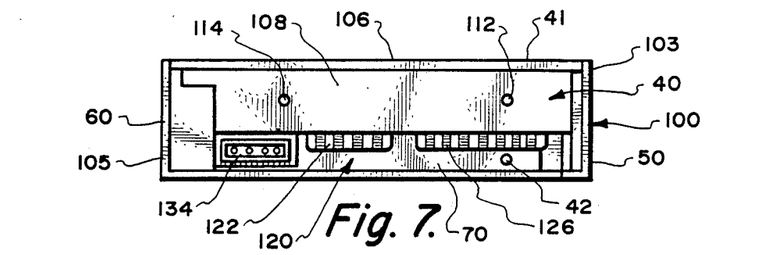
FIG. 7 illustrates an elevational view of the back face of the invention with the cartridge in place.

The rear cross brace 106 of the mount or support bracket 100 is L-shaped in cross-section. FIG. 7 shows a rear elevational view of the back face of the present invention with the cartridge 40 fully slid into place in the bracket 100. The back face as disclosed in FIG. 7 shows the vertical half section 108 of the L-shaped cross brace 106 with a pair of rivets 112 and 114 shown.

The pair of rivets serves to hold electrical circuit means interconnecting the bracket 100 to the computer and is illustrated as an electronic circuit board 120 and connectors immediately inside this vertical section 108 of the cross brace. A portion of this electronic circuitry can be shown extending below the edge of the vertical section 108 of the cross brace in FIG. 7.

Figure 5:
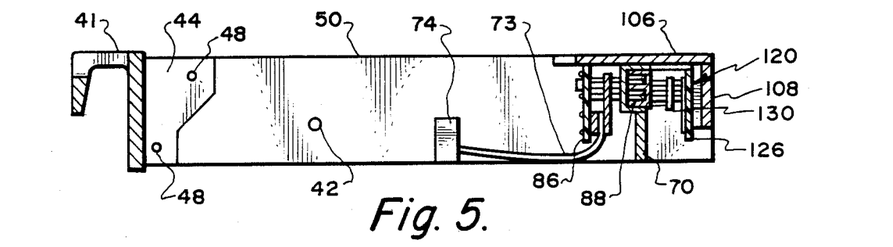
FIG. 5 is a longitudinal cross-sectional view taken along the lines 5—5 of FIG. 3 illustrating parts of the electrical connections and the interior left side of the cartridge.
Figure 6:
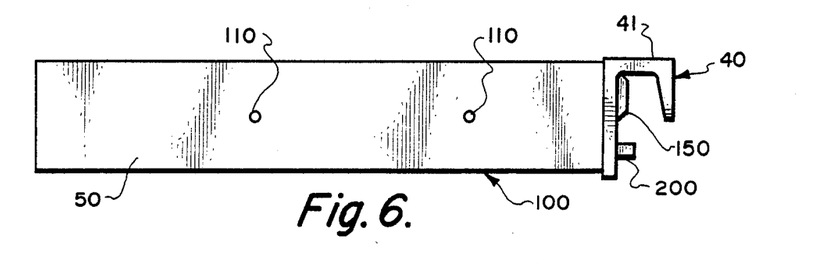
FIG. 6 is an elevational view illustrating the outer face of the left hand section of the bracket and pull out handle of the cartridge.
Figure 8:
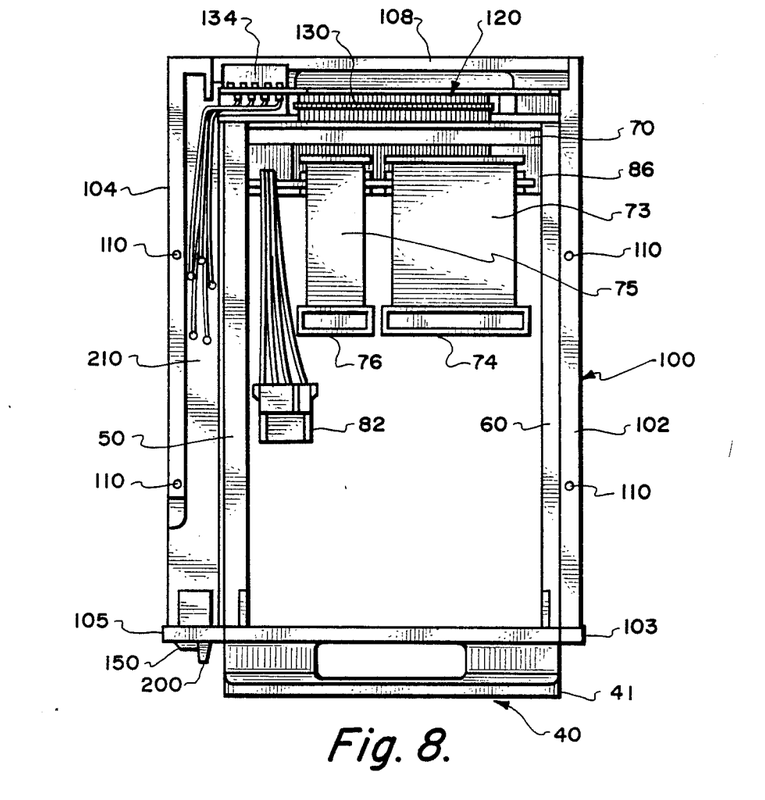
FIG. 8 is a bottom plan view of the invention with the cartridge in place and further illustrating the electrical connections between the support bracket and the cartridge.

Additionally, the cross-sectional view of the electronic circuitry attached to cross brace 106 of the bracket 100 and rear section 70 of cartridge 40 is shown in FIGS. 5, 7 and 8. This electronic circuitry includes a printed circuit board 120 having a 20 pin card connector 122 and a 32 pin card connector 126 positioned side-by-side and extending down from the printed circuit board 120. Attached to the printed circuit board 120 and interconnecting with the pin card connectors 122 and 126 is a mateable 64 pin connector 130. Placed adjacent to the 20 pin card connector 122 is a mateable "Molex" plug 134. The "Molex" plug is secured to the circuit board 120. This entire circuitry is mounted and riveted inside the bight area of the L-shaped cross-section as illustrated in FIG. 5. The purpose of the 20 pin card connector 122, the 32 pin card connector 126 and the "Molex" the mainframe mount below the cross brace 106, is to allow the three electrical components in the computer to be connected to the back of the mainframe mount 10. In turn, this electrical circuitry, other than the "Molex" plug which provides the power to the hard drive, is wired or otherwise connected by an electronic circuit to the mateable 64 pin connector 130.

The two components which comprise the invention are the mainframe mount, also termed the support bracket 100 and the slide-in cartridge 40 which holds the hard drive 12 or more broadly termed the information storage device, in place. The slide-in cartridge is shown in perspective in FIG. 2 detached from the mount. The cartridge resembles a rectangular box without a bottom. The cartridge, as disclosed, includes an integrated pull handle 41 forming the front face of the cartridge. There are two side sections termed a left side 50 and a right side 60 forming the two sides of the cartridge. The rear section 70 is fastened between the ends of the left and right sides and is secured by four Allen head screws 72, two on each side. The front face which can include the integral pull handle 41, has two mounting extensions 44 and 46 positioned at right angles behind the face. They are fastened to the left and right hand sides 50 and 60 by means of two pairs of Allen head screws 48, two to each extension. This four piece construction comprising the cartridge provides for a very rigid and durable slide-in cartridge. As previously mentioned, the cartridge is also fabricated as a one-piece unit by a plastic injection molding process or by an aluminum casting process. There are two pairs of mounting hole 42 drilled into the left side 50 and the right side 60. These mounting holes will match up with the mounting holes on the standard 3½ inch hard disk drive. The hard disk drive is installed in the cartridge with the electrical terminals of the hard disk drive positioned towards the rear face 70 of the cartridge. The hard drive will have a card connector comprising a 32 pin card connector and a 20 pin card connector located on the upper surface of the hard disk drive on the SCSI configuration.

Additionally, the hard drive will have a mateable "Molex" plug adjacent to both card connectors. After the hard drive has been screwed into place in the cartridge, the ribbon wire 73 and 32 pin ribbon terminator 74 on the cartridge is connected with the 32 pin card connector on the hard drive. Then the ribbon wire 75 and 20 pin ribbon terminator 76 extending from the cartridges is connected to the 20 pin card connector on the hard drive, and the male type "Molex" plug 82 extending from the cartridge is then connected with the female "Molex" plug on the hard drive. After these steps have been completed, the hard drive 12 is now fully installed and operational in the cartridge 40.

FIG. 1 illustrates how the hard drive will look when it is correctly positioned in the cartridge. The side heights of both the left side 50 and right side 60 of the cartridge are of sufficient dimensions so that the thickness of the hard drive is less than these two heights so that the hard drive 12 will not interfere with the sliding in or out of the cartridge 40 into the mainframe mount 100.

The cartridge has electrical circuit means for interconnecting with the hard disk and is illustrated as a printed circuit board 86 attached to the inside of the rear face 70 of the cartridge. It is attached by a pair of screws 84 and 85. Part of the rear section is cut away. The printed circuit board 86 has wired to it a mateable 64 pin connector 88 positioned in the cut away portion. The face of this mateable 64 pin connector is flush with the back face 70. The purpose of the 64 pin connector is to interconnect the cartridge containing the hard disk drive with the electrical connections in the mainframe mount or bracket. As previously stated, the mainframe mount or support bracket has the mateable 64 pin connector 88 attached to a printed circuit board 120 and riveted to the inside bight area of the cross brace 106. When the cartridge is slid into the mount or bracket, the interconnecting electrical means between the cartridge and the bracket illustrated as the two complementary 64 pin mateable connectors 88 and 130 will align. When the cartridge is pushed hard enough into the bracket the two will mate or couple with each other thereby completing the electrical connection from the hard drive to the bracket and thereby the computer, also called the external circuitry. These 64 pin connectors 88 and 130 are separable types of electrical connections and can be pulled apart whenever force is applied to the pull handle 41 of the cartridge to pull the two connectors apart.

The left and right sides 50 and 60 of the cartridge each have a pair of horizontal tracks grooved out along the length of both sides. Additionally, towards the back area of the side, there are notches 51 and 61 cut away to avoid interfering contact with the cross brace 106 on the mainframe mount or support bracket 100. These two tracks 52 and 54 match up with the pair of guide rails 121 and 123 which are formed on the inside faces of the left leg 102 and the right leg 104, respectively, which form the sides of the U-shaped mount. These two complementary sets of guide rails 121 and 123 and tracks 52 and 54 allow the cartridge to be easily slid into the mount. They also provide for the alignment between the mateable pin connectors 88 and 130. When the cartridge 40 is pushed all the way in, the front end 103 of the left side leg 102 and the front end 105 of the right leg 104 of the bracket, and the face of the cartridge will lie flush with each other. There is an optional feature shown in the drawings and positioned in the cavity area of the right leg 104 of the bracket. This cavity and the front 105 of the right leg 104 provide a mounting location for a locking means illustrated as a lock 150 actuated by a key 152, and a latch 154 attached at the end so that the latch can be positioned into a slot 45 cut away in the right side 60 of the cartridge and also a slot (not shown) in the right leg 104 of the mainframe mount or support bracket. By means of turning the key 152 to move the latch into the slots, the cartridge is locked with the mount, and cannot be removed until the appropriate key is inserted and the latch is released from the locking slots thereby allowing the cartridge to be pulled out and removed from the mount 100.

Positioned below the lock area is an on-line switch means illustrated as a connector switch 200 and its respective printed circuit board 210. The purpose of this on-line connector switch is to interrupt power from the CPU to the hard disk drive, that is to turn the hard disk drive off without the inconvenience of turning off the computer first. If one were to pull out the cartridge from the bracket while the hard drive is still energized, it could cause damage to the hard drive and resulting loss of data stored in the hard disk drive.

A replacement for the on-line switch is not disclosed in the drawings. However, it would consist of a solenoid appropriately wired in the mount so that if one were to inadvertently attempt to pull out the cartridge while the hard drive is still on, the solenoid would prevent this before the power was turned off.

The electrical components of the mainframe mount or bracket have already been discussed. The printed circuit board 210 which interconnects the mateable "Molex" plug 134 to the on/off switch 200 is wired so that the power coming from the computer to the "Molex" plug 134 in the support bracket would first pass through the on-line switch 200 before electricity flows to the hard disk drive by way of the "Molex" plug 82 on the cartridge. The mateable "Molex" plug 134 in the support bracket is connected with the "Molex" plug inside the CPU, which was previously connected to the floppy disk drive but replaced by the present invention. Alternatively, the "Molex" plug could be part of an interface card which would have to be installed in one of the computer's expansion slots in the event the computer is not wired for the present invention. The "Molex" plug contains four wires. One wire supplies 5 volts which runs some of the components in the hard disk drive. The other wire supplies 12 volts to the hard disk drive which runs other components of the hard drive. The other wires are grounds.

By installing the present invention in an information storage device, the non-removable 5¼ inch Winchester hard drive has been replaced with a removable hard drive system which can essentially perform the same functions as the original 5¼ inch half-height Winchester drive. The cartridge can hold a variety of devices in addition to the 3½ inch Winchester hard drive. For example, a smaller hard drive could be mounted, or a floppy disk drive, an optical disk drive, a tape drive or a solid state memory. In some of these applications, the area where the integrated pull handle is located, which allows the slide-in cartridge to be easily slid in and pulled out by the operator, there will of necessity have to be a slot cut away and perhaps the pull handle modified to allow for the slots in order to allow access to insert or remove an optical disk or a tape cartridge. These other optional components which can be mounted on the slide-in cartridge are collectively referred to as information storage devices.

Figure 9:
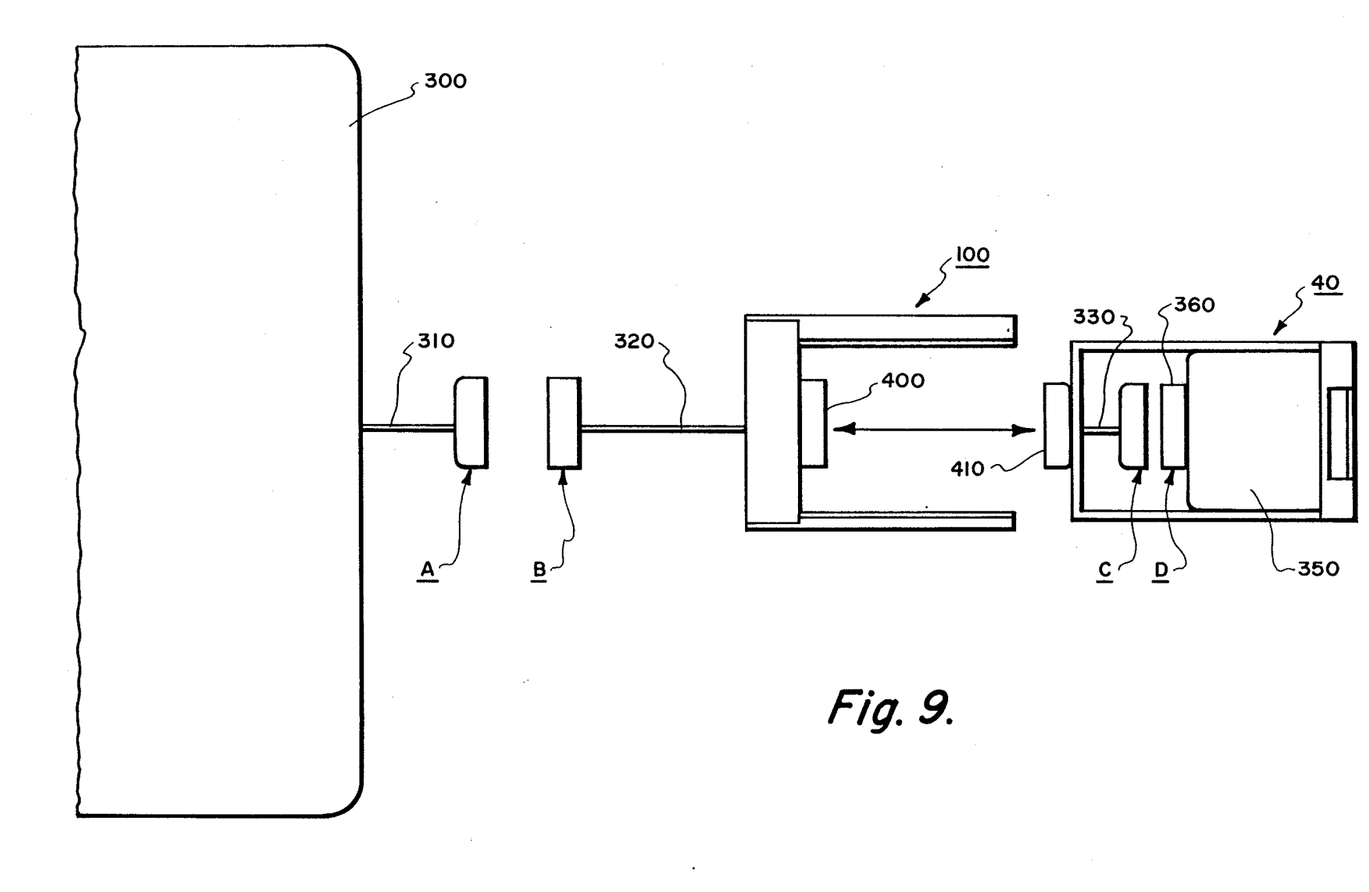
FIG. 9 is a schematic drawing of the invention illustrating the various electrical connections and mechanical components.

The present invention is also illustrated schematically in FIG. 9. FIG. 9 shows a computer system 300 or other information system to which the invention could be wired. The external circuit 310 is also referred to as circuit A. The support bracket 100 is shown with the cable connections 320. The circuitry extending from the bracket is referred to as B. The slide-in cartridge 40 is shown detached from the bracket 100. Inside the slide-in cartridge 40 is the information storage device 350. In the illustrated embodiment this information storage device is the 3½ inch hard drive 12. This information storage device 350 has a set of terminals 360. Emanating from the cartridge 40 and connecting with the information storage device 350 is a collection of electrical connections 330. The terminals on the information storage device are labeled D for discussion purposes and the cables connecting D to the cartridge are labeled C. If the operator of a system such as a personal computer 300 wanted to install a 3½ inch disk drive 350, there would have to be hook up cables (not shown) to allow the hard drive to communicate with the computer. Schematically, this would mean that hookup A must be compatible with terminals D. Since the purpose of the invention is to permit the hard drive to be insertable and removable from the computer without the inconvenience of disassembling the computer, there must be a requirement of a compatible hookup somewhere between the external circuit 310 and the information storage device 350.

Schematically, circuitry A must be functionally identical to circuitry C. Additionally, terminals B from the bracket must be functionally the same as the terminals D on the information storage device. In a mathematical sense, A=C and B=D. Furthermore, when A connects with B, it is the same type of connection as C connecting with D. The type of information storage device 350 to be utilized in the present invention will determine the types of terminals A, B, C and D which will have to be used so that the information storage device can be connected to the system 300. For example, if the information storage device is an optical disk reader, then the D terminals which emanate from it will have to have complementary connections A so that the device can talk to the system 300. When the bracket and cartridge are interposed between A and D, the terminals B on the bracket must mimic those terminals D on the information storage device 350 so that the external circuit can be hooked up with the bracket. Likewise, in the cartridge there must be the connector C which will mimic the electrical connectors A of the external circuit so that C and D can be plugged together. The final connection in this schematic is the mateable connectors 400 and 410 which will connect whenever the cartridge 40 is fully inserted in the support bracket 100. This connection 400 and 410 is known as a mateable connector and in the illustrations is shown as a pair of mateable pin connectors.

Figure 10:
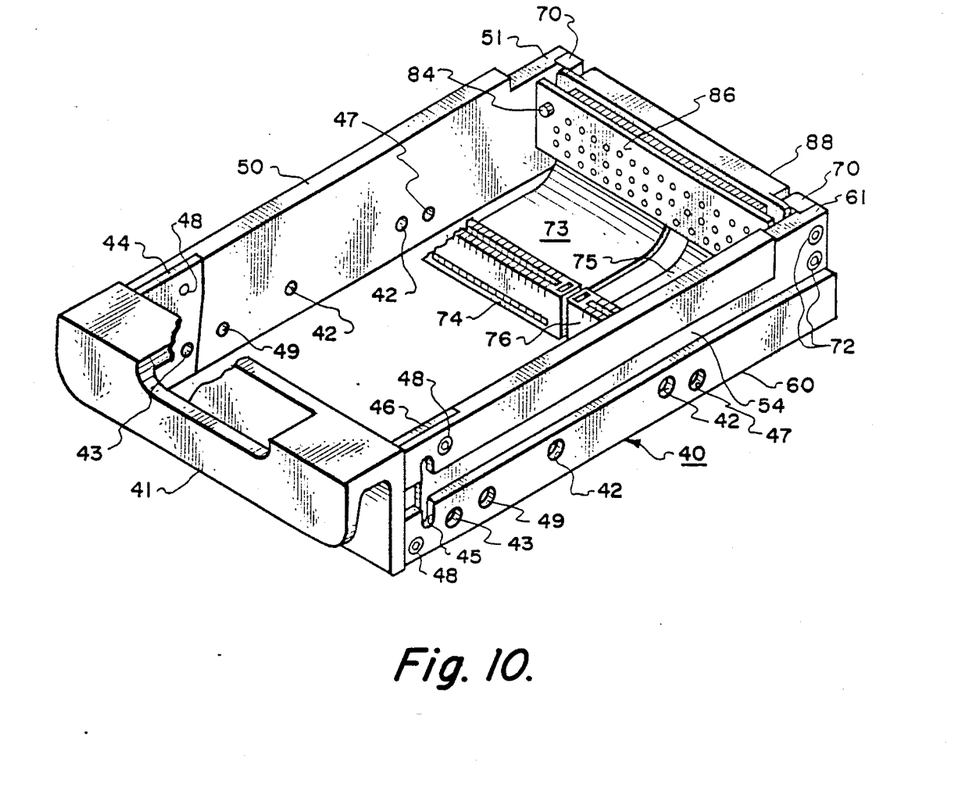
FIG. 10 is an isometric view of a modified cartridge constructed to facilitate connection with numerous different types of information storage devices (hard drives).

Within both the left side 50 and the right side 60 of the cartridge 40 are additional pairs of mounting holes, pair 43, pair 47 and pair 49. Mounting holes 43 are in alignment between the sides 50 and 60 as well as pairs 47 and 49. This alignment is perpendicular to the longitudinal direction of movement of the cartridge 40 relative to the support bracket 100. It is to be understood that there is one mounting hole 43, 47 and 49 mounted in each side 50 and 60. Inclusion of the two sets of mounting holes 42 and the additional sets 43, 47 and 49 facilitates the connection of the cartridge 40 to almost all manufacturers of information storage devices (hard drives). It has been found that the cartridge 40 shown in FIG. 10 is connectable to the hard drives by the following manufacturers and the following models:

| MANUFACTURER | MODEL NUMBER(S) |
|---|---|
| C. ITOH | YD-3540 |
| | YD-3530 |
| CONNER PERIPHERALS, INC. | CP 3100 |
| | CP 340 |
| | CP 342 |
| FUJITSU | M 2225D |
| | M 2226D2 |
| | M 2227D2 |
| | M 2226DR |
| | M 2227DR |
| IMPRIMIS | SWIFT 94355 |
| | SWIFT 94351 |
| | SWIFT 94354 |
| | SWIFT 94356 |
| LAPINE | LT 200 |
| MINISCRIBE | 8212 |
| | 8412 |
| | 8425 |
| | 8438 |
| NEC INFORMATION SYSTEMS, INC. | D 3126 |
| SEAGATE | ST 125 |
| | ST 138 |
| | ST 138R |
| | ST 157 R |
| TANDON | TM 362 |
| TOSHIBA | MK 134 FA |

The holes 42 are to be utilized for the hard drives that are manufactured by C. Itoh, Fujitsu, Imprimis, Lapine (Kyocera), Miniscribe, NEC Information Systems, Inc., Seagate, Tandon, and Toshiba. Mounting holes 47 and 49 are utilized for Model No. CP 3100 of Conner Peripherals, Inc. Mounting holes 43 and 47 are utilized for Model No. CP 340 and CP 342 of Conner Peripherals, Inc.

What is claimed is:

1. An adapter having a removable slide-in cartridge means for an information storage device for mounting at most locations where a standard size 5¼ inch half-height Winchester drive could be mounted, said adapter comprising:
    a generally U-shaped support bracket having a cross brace means and having overall dimensions no larger than a standard 5¼ inch half-height Winchester drive;
    a generally rectangular shaped cartridge for holding an information storage device, said cartridge slideably engageable with and disengageable from said support bracket;
    first electrical circuit means for interconnecting the information storage device with said cartridge;
    second electrical circuit means for interconnecting said support bracket to an exterior circuit;
    mateable electrical connector means mounted on said support bracket and said cartridge for making an electrical connection between said bracket and said cartridge when said bracket and said cartridge are fully interengaged; and
    an on-line switch interconnecting said second electrical circuit means and the information storage device for manually controlling the power to the information storage device without affecting the power of a computer system within which said adapter is to be mounted.

2. The adapter as defined within claim 1 wherein:
    said mateable electrical connector means includes a multiple circuit mateable connector.

3. In combination with a computer housing, said computer housing having a port for receiving a disk drive apparatus, said disk drive apparatus comprising:
    a support bracket separably mounted within said port and electrically connected to said computer housing, said support bracket being bifurcated defining a pair of spaced apart legs, each said leg having an inner surface with said inner surfaces located in a facing relationship to each other, a first electrical connector mounted on said support bracket;
    a cartridge, said cartridge defining a box-like frame enclosing an open space, said open space having an open top and an open bottom, a second electrical connector mounted to said box-like frame and located within said open space, a third electrical connector mounted on said box-like frame, said cartridge having side walls, each said side wall having an exterior surface, said cartridge to be located between said legs of said support bracket in a closely conforming manner, said cartridge to be readily removable from said support bracket and be separated therefrom, and when said cartridge is fully inserted in position between said legs said third electrical connector is electrically connected with said first electrical connector;
    a disk drive being fixedly mounted by mounting means to said cartridge, said disk drive being wholly contained within said open space, said disk drive being electrically connected to said second electrical connector, said second electrical connector being electrically connected to said third electrical connector; and
    a cooperating guide rail arrangement and track arrangement mounted on said exterior surface of each said side wall of said cartridge and said inner surface of each said leg of said supporting bracket, said guide rail arrangement and said track arrangement permitting only longitudinal movement between said cartridge and said support bracket and insures that positive electrical connection is always produced between said third electrical connector and said first electrical connector when said cartridge is fully inserted within said support bracket.

4. The combination as defined in claim 3 wherein:
    said mounting means comprises a plurality of pairs of mounting holes formed within said side walls, each said pair of said mounting holes being in transverse alignment and perpendicular to the longitudinal direction of movement between said cartridge and said support bracket, said mounting holes facilitating connection to a wide variety of disk drives of different manufacturers.

* * * * *